US007329079B2

(12) United States Patent
Ohkawara et al.

(10) Patent No.: US 7,329,079 B2
(45) Date of Patent: Feb. 12, 2008

(54) SEMICONDUCTOR WAFER PROCESSING MACHINE

(75) Inventors: Satoshi Ohkawara, Tokyo (JP); Takaaki Inoue, Tokyo (JP)

(73) Assignee: Disco Corporation, Tokyo (JP)

( * ) Notice: Subject to any disclaimer, the term of this patent is extended or adjusted under 35 U.S.C. 154(b) by 289 days.

(21) Appl. No.: 10/864,525

(22) Filed: Jun. 10, 2004

(65) Prior Publication Data

US 2004/0265100 A1 Dec. 30, 2004

(30) Foreign Application Priority Data

Jun. 18, 2003 (JP) .............................. 2003-172999

(51) Int. Cl.
*H01L 21/67* (2006.01)
(52) U.S. Cl. .............. 414/217; 414/217.1; 414/416.03; 414/936; 414/940
(58) Field of Classification Search ................ 414/217, 414/217.1, 416.03, 936, 940
See application file for complete search history.

(56) References Cited

U.S. PATENT DOCUMENTS 5,546,179 A * 8/1996 Cheng ......................... 356/73
6,164,894 A * 12/2000 Cheng ................... 414/416.03
6,500,047 B2 * 12/2002 Arai et al. ..................... 451/14
6,527,031 B1 * 3/2003 Yanagita et al. ............. 156/584
6,846,149 B2 * 1/2005 Savage et al. ......... 414/416.03

FOREIGN PATENT DOCUMENTS

JP         2003 163184         6/2003

* cited by examiner

*Primary Examiner*—Saul Rodriguez
*Assistant Examiner*—M. S. Lowe
(74) *Attorney, Agent, or Firm*—Smith, Gambrell & Russell, LLP (57) ABSTRACT

A semiconductor wafer processing machine comprising a cassette-placing mechanism having a cassette-placing table for placing a cassette storing a semiconductor wafer, a workpiece take-in/take-out mechanism for taking out the semiconductor wafer stored in the cassette placed on the cassette-placing table and taking the semiconductor wafer into the cassette, a workpiece conveying mechanism for conveying the semiconductor wafer taken out by the workpiece take-in/take-out mechanism, a chuck table mechanism having a chuck table for holding the semiconductor wafer conveyed by the workpiece conveying mechanism, and a processing mechanism for processing the semiconductor wafer held on the chuck table, wherein the cassette-placing mechanism comprises an aligning mechanism for aligning the crystal orientation of the semiconductor wafer, which is situated below the cassette-placing table.

4 Claims, 5 Drawing Sheets

SEMICONDUCTOR WAFER PROCESSING MACHINE

FIELD OF THE INVENTION

The present invention relates to a semiconductor wafer processing machine such as a cutting machine for dividing a semiconductor wafer into individual semiconductor chips.

DESCRIPTION OF THE PRIOR ART

In the production process of a semiconductor device, for example, individual semiconductor chips are manufactured by forming a circuit such as IC or LSI in a plurality of areas arranged in a lattice form on the front surface of a semiconductor wafer that is a substantially disk-like sheet, and dividing the circuit formed areas along predetermined cutting lines called "streets" by a dicing machine. Dividing of the semiconductor wafer is generally carried out by a cutting machine as the dicing machine. This cutting machine comprises a cassette-placing mechanism having a cassette-placing table for placing a cassette that stores semiconductor wafers, a take-in/take-out mechanism for taking out the semiconductor wafer stored in the cassette placed on the cassette-placing table from the cassette and taking it into the cassette, a chuck table for holding the semiconductor wafer taken out by the take-in/take-out mechanism, and a processing mechanism for processing the semiconductor wafer held on the chuck table.

The above semiconductor wafer is stored in the cassette in a state of being affixed on the front surface of a protective tape put on an annular frame so that semiconductor chips do not fall apart when the semiconductor wafer is divided into individual chips. Meanwhile, in a dividing technique so called "pre-dicing" in which a cutting groove having a predetermined depth is formed along the streets without dividing the semiconductor wafer into individual chips completely by a cutting machine and then, the back surface of the semiconductor wafer is ground until the above cutting grooves are exposed to divide the semiconductor wafer into individual chips, the semiconductor wafer stored in the cassette of the cutting machine does not need to be supported to the frame by the protective tape.

As described above, the semiconductor wafer supported to the frame by the protective tape is mounted by aligning a mark indicative of its crystal orientation with the predetermined position of the frame, and the frame supporting the semiconductor wafer can be stored in the cassette in a predetermined direction. Therefore, by taking out the frame to the predetermined position of a temporary storage area, the center position and the position indicative of the crystal orientation of the semiconductor wafer supported to the frame are automatically aligned. On the other hand, when the simple semiconductor wafer is to be cut and processed, the semiconductor is stored in the cassette. Accordingly, as the semiconductor wafer is substantially shaped like a disk, it is difficult to align the center position and the crystal orientation of the semiconductor wafer when the semiconductor wafer is stored in the cassette and taken out from the cassette.

To solve the above problem, the applicant proposes a cutting machine comprising a temporary storage area for temporarily storing a semiconductor wafer taken out from a cassette placed on a cassette-placing table and an aligning mechanism installed in the temporary storage area, as JP-A 2003-163184.

When the temporary storage area for installing the aligning mechanism is located adjacent to the cassette-placing table as proposed above, the downsizing of the processing machine is hindered.

SUMMARY OF THE INVENTION

It is an object of the present invention to provide a processing machine which comprises an aligning mechanism for a semiconductor wafer and can be reduced in size.

To attain the above object, according to the present invention, there is provided a semiconductor wafer processing machine comprising a cassette-placing mechanism having a cassette-placing table for placing a cassette storing a semiconductor wafer, a workpiece take-in/take-out mechanism for taking out the semiconductor wafer stored in the cassette placed on the cassette-placing table and taking the semiconductor wafer into the cassette, a workpiece conveying mechanism for conveying the semiconductor wafer taken out by the workpiece take-in/take-out mechanism, a chuck table mechanism having a chuck table for holding the semiconductor wafer conveyed by the workpiece conveying mechanism, and a processing mechanism for processing the semiconductor wafer held on the chuck table, wherein the cassette-placing mechanism comprises an aligning mechanism for aligning a position of the crystal orientation of the semiconductor wafer, which is situated below the cassette-placing table.

Preferably, the above cassette-placing mechanism has a lifting means for bringing the cassette placed on the above cassette-placing table to a first take-in/take-out position where the cassette is positioned in the take-in/take-out area of the workpiece take-in/take-out mechanism, and for bringing the aligning mechanism to a second take-in/take-out position where the aligning mechanism is positioned in the take-in/take-out area of the workpiece take-in/take-out mechanism.

The above aligning mechanism comprises a center table for placing the semiconductor wafer, a semiconductor wafer crystal orientation detection means for detecting a mark indicative of the crystal orientation formed on the outer peripheral wall of the semiconductor wafer placed on the center table, and a turning means for turning the center table. Preferably, there are provided a plurality of semiconductor wafer crystal orientation detection means corresponding to the sizes of the semiconductor wafer.

Preferably, the above aligning mechanism comprises a centering member which contacts with the outer peripheral wall of the semiconductor wafer, and the centering member comprises a plurality of position regulating portions corresponding to the sizes of the semiconductor wafer.

Other features of the present invention will become apparent from the following description.

DETAILED DESCRIPTION OF THE PREFERRED EMBODIMENTS

A preferred embodiment of the processing machine constituted according to the present invention will be described in detail hereinunder with reference to the accompanying drawings.

Figure 1:
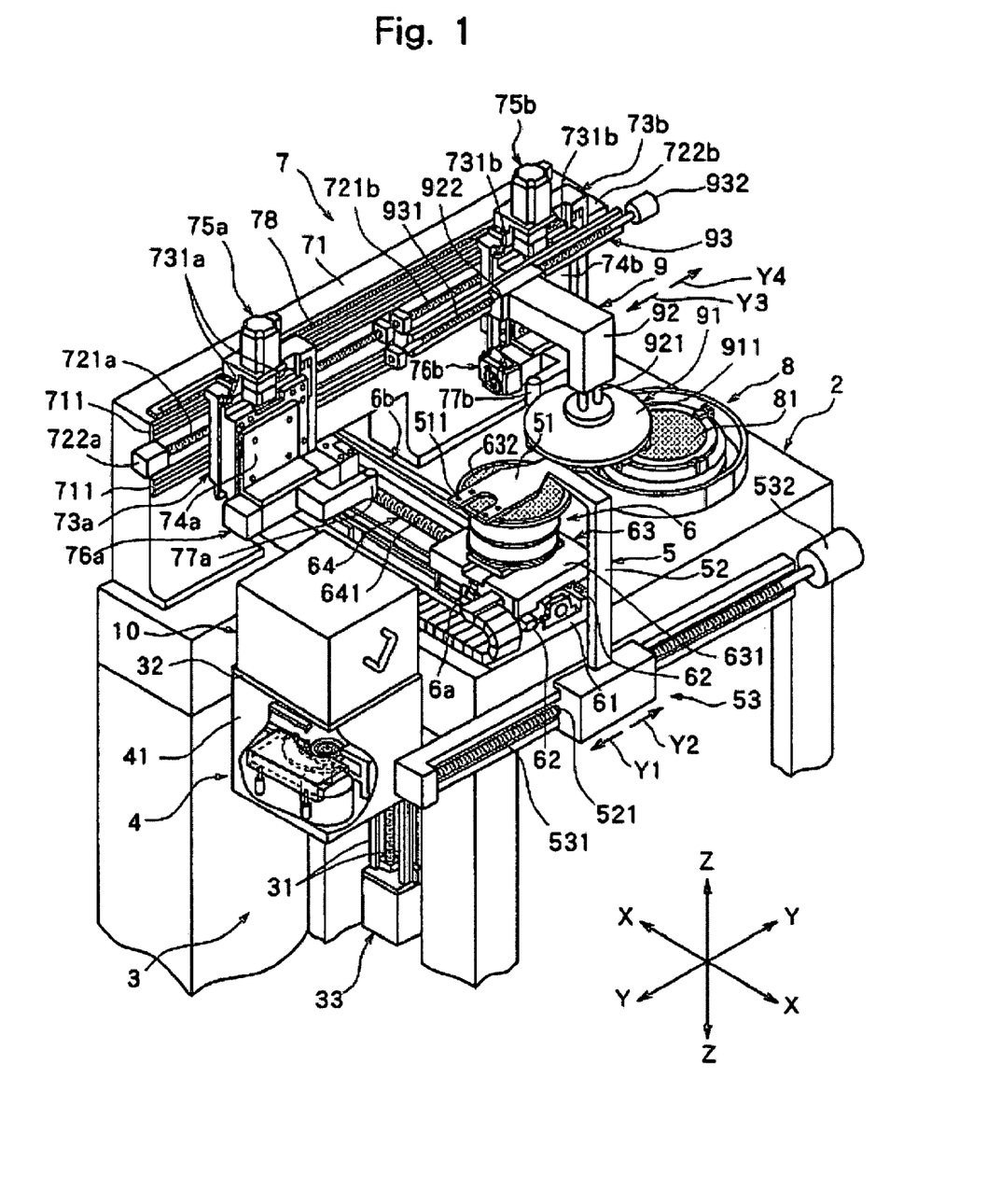
FIG. 1 is a perspective view of a cutting machine which is a processing machine constituted according to the present invention.

FIG. 1 is a perspective view of a cutting machine as the processing machine constituted according to the present invention.

The cutting machine in the illustrated embodiment has a stationary base 2. On the flank of the stationary base 2, there is installed a cassette-placing mechanism 3. The cassette-placing mechanism 3 comprises a cassette-placing table 32 which is slidably mounted onto two guide rails 31 installed on the flank of the stationary base 2 in a vertical direction, an aligning mechanism 4 for aligning the crystal orientation of a semiconductor wafer as a workpiece, situated below the cassette-placing table 32, and a lifting means 33 for moving the cassette-placing table 32 and the aligning mechanism 4 along the guide rails 31 in the vertical direction (direction shown by an arrow Z).

Figure 2:
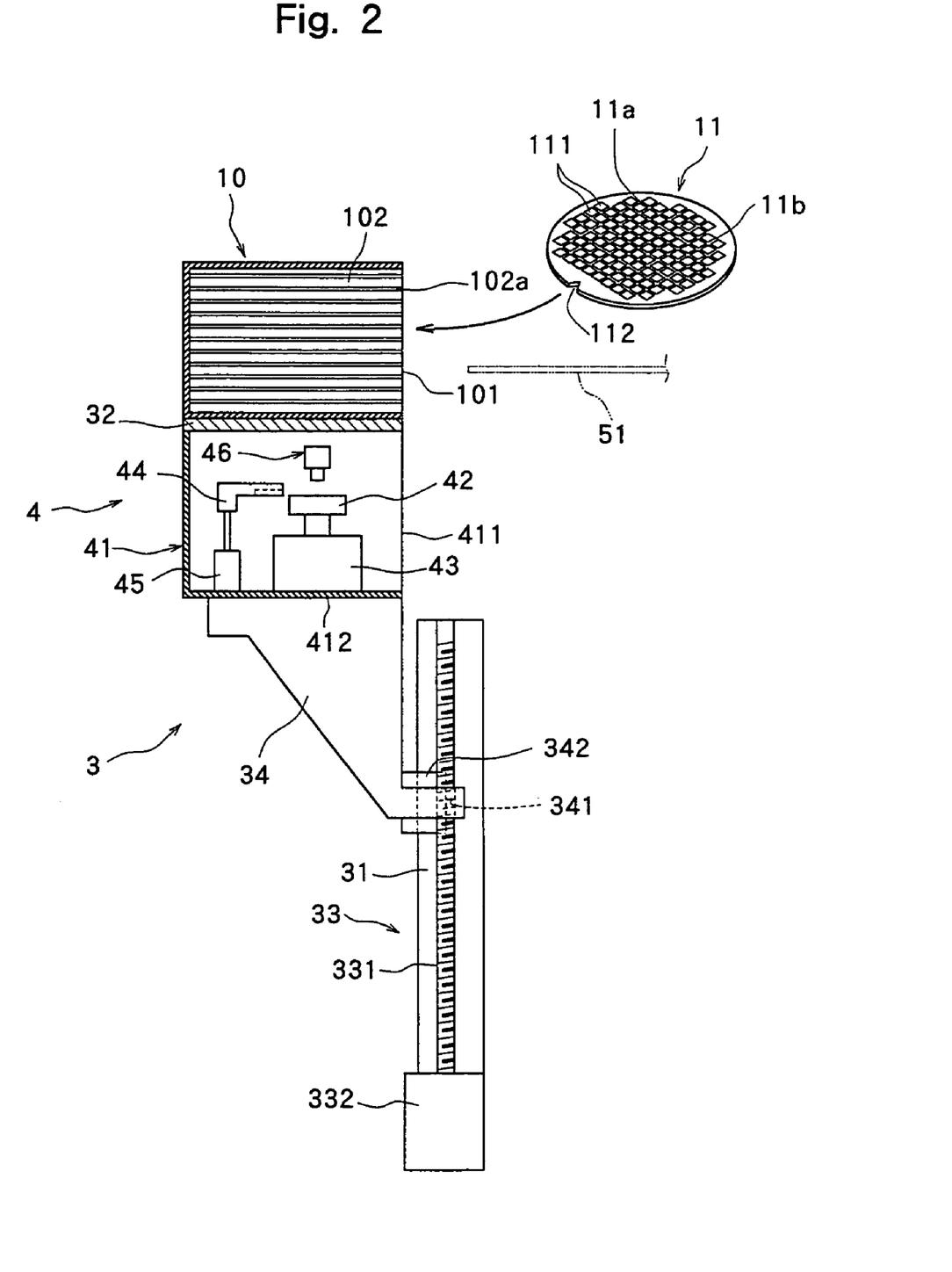
FIG. 2 is an explanatory diagram illustrating a first take-in/take-out position of the cassette-placing mechanism of the cutting machine shown in FIG. 1.
Figure 3:
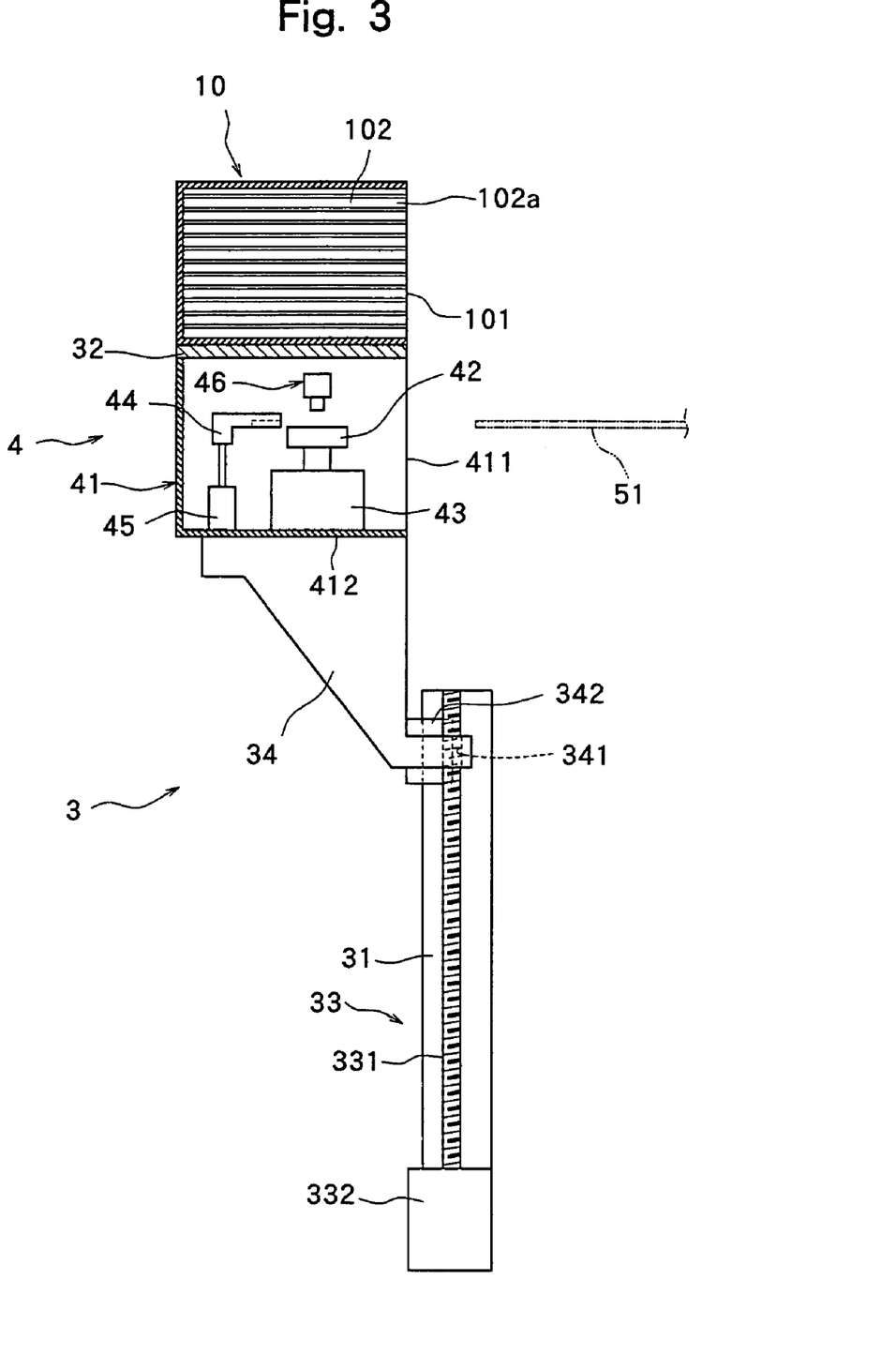
FIG. 3 is an explanatory illustrating a second take-in/take-out position of the cassette-placing mechanism of the cutting machine shown in FIG. 1.

In the illustrated embodiment, the cassette-placing table 32 and the housing 41 of the aligning mechanism 4 are constituted in an integrated manner. That is, as shown in FIG. 2 and FIG. 3, the cassette-placing table 32 serves as the upper wall of the housing 41. On the top of the cassette placing table 32, there is installed a cassette 10 for storing semiconductor wafers as workpieces. This cassette 10 has an opening 101 for taking in and out the workpiece and a plurality of racks 102a for placing the semiconductor wafers on the inner walls of both side walls 102 and 102, which are arranged in such a manner that they are opposed to each other in the vertical direction. The semiconductor wafer 11 as a workpiece stored in the cassette 10 is formed in a disk-like shape, and a circuit 111 such as IC or LSI is formed in a large number of areas arranged in a lattice form on the front surface of the semiconductor wafer. On the outer periphery of the semiconductor wafer 11 thus constituted, there is provided with a notch 112 indicative of the crystal orientation of the semiconductor wafer.

The aligning mechanism 4 situated below the cassette placing table 32 has a housing 41 whose top wall is constituted by the cassette placing table 32. This housing 41 has a workpiece take-in/take-out opening 411 for taking in and out the semiconductor wafer 11 as a workpiece on the right side in FIGS. 2 and 3. A center table 42 for placing the semiconductor wafer 11 is installed in the housing 41. A pulse motor 43 as a turning means suitably turns this center table 42. The center table 42 is connected to a negative pressure control means (not shown) so that negative pressure is applied thereto.

Figure 4:
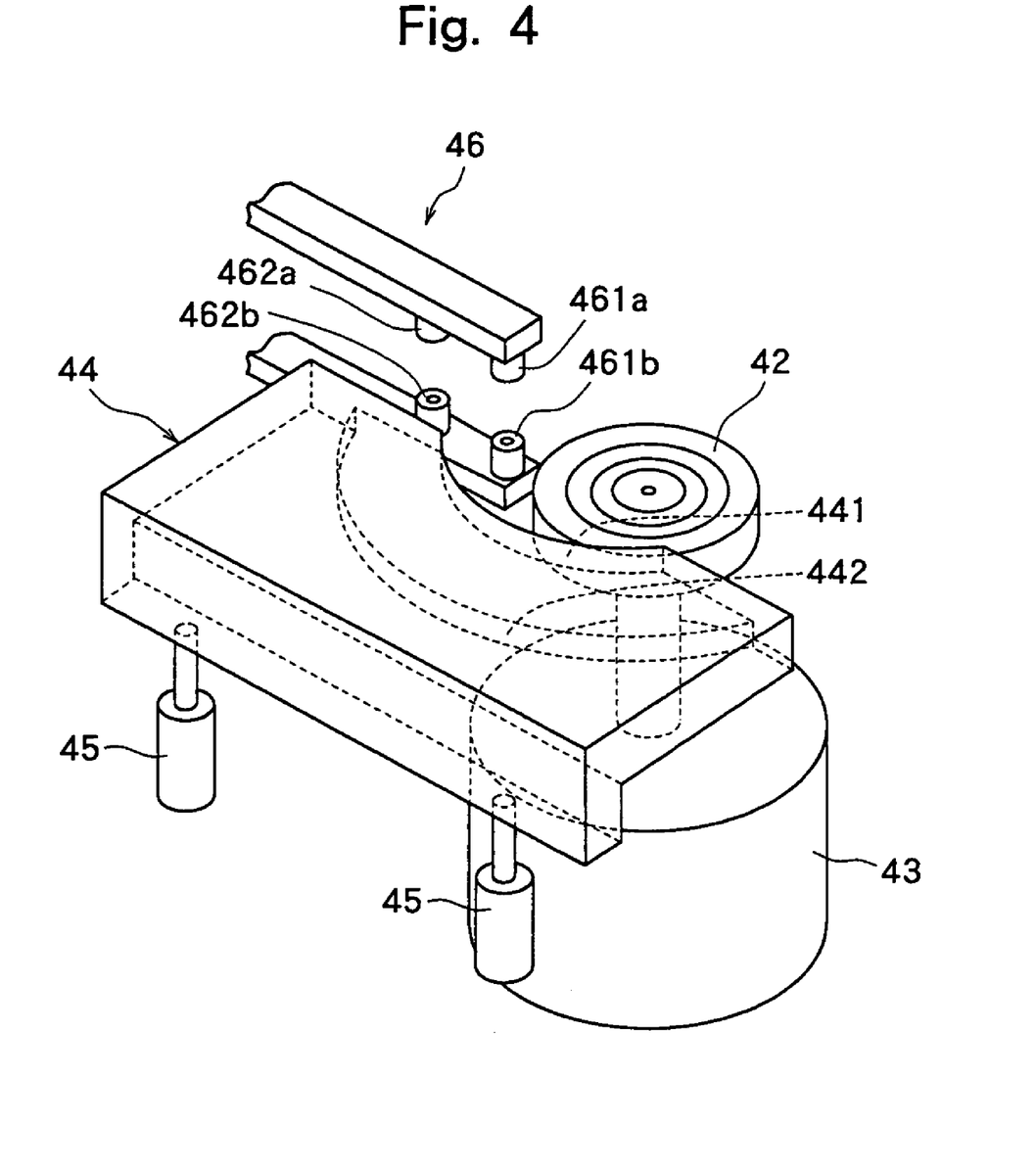
FIG. 4 is a perspective view of the aligning mechanism of the cutting machine shown in FIG. 1.
Figure 5:
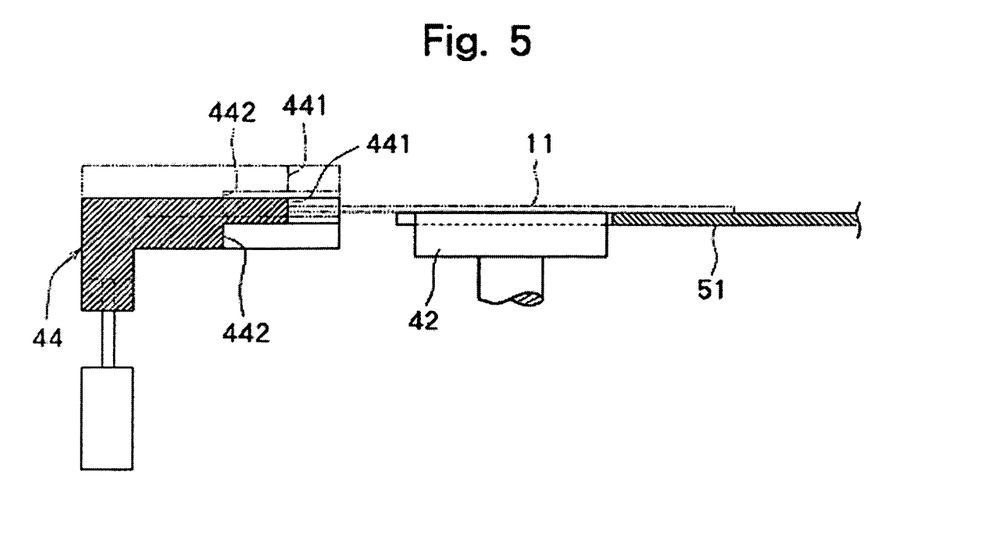
FIG. 5 is a sectional view of the principal section of the aligning mechanism shown in FIG. 2.

The aligning mechanism 4 in the illustrated embodiment has a centering member 44 on the left side in FIG. 2 and FIG. 3 of the above center table 42, that is, on a side opposite to the workpiece take-in/take-out opening 411 of the center table 42. The centering member 44 has an upper arc face 441 and a lower arc face 442 as position regulating portions, which come into contact with part of the outer peripheral surface of the semiconductor wafer 11 on the flank on the center table 42 side as shown in FIG. 4 and FIG. 5. The upper arc face 441 is formed for a radius of, for example, an 8-inch semiconductor wafer and the lower arc face 442 is formed for a radius of, for example, a 12-inch semiconductor wafer. The formed centering member 44 is arranged in such a manner that the arc faces 441 and 442 become concentric to the center table 42. The centering member 44 is moved in the vertical direction by air cylinders 45 and 45.

The aligning mechanism 4 in the illustrated embodiment comprises a semiconductor wafer crystal orientation detection means 46 situated at a position shifted by 90° from the center position of the arc faces 441 and 442 provided in the above centering member 44. This semiconductor wafer crystal orientation detection means 46 consists of, for example, a light emitting device 461a and a light receiving device 461b for an 8-inch semiconductor wafer and, for example, a light emitting device 462a and a light receiving device 462b for a 12-inch semiconductor wafer.

The bottom 412 of the housing 41 of the aligning mechanism 4 constituted as described above is fixed on a support base 34 which is moved in the vertical direction by lifting means 33 as shown in FIG. 2 and FIG. 3.

The lifting means 33 in the illustrated embodiment comprises a male screw rod 331 that is interposed between the above guide rails 31 in the vertical direction and rotatably supported, and a pulse motor 332 for turning the male screw rod 331, which can turn in a normal direction and adverse direction. The male screw rod 331 is screwed into a threaded hole 341 formed in the proximal end portion of the support base 34. A guided portion 342 that is guided along the above guide rails 31 is provided to the proximal end portion of the support base 34. Therefore, when the pulse motor 332 is rotationally driven in one direction, the support base 34 is moved up along the male screw rod 331 and the guide rails 31, and when the pulse motor 332 is rotationally driven in the other direction, the support base 34 is moved down along the male screw rod 331 and the guide rails 31. The support base 34 thus moved in the vertical direction is positioned to a first take-in/take-out position where the cassette 10 placed on the cassette placing table 32 is opposed to a hand positioned in the take-in/take-out area of the workpiece take-in/take-out mechanism that will be described later, as shown in FIG. 2 and to a second take-in/take-out position where the aligning mechanism 4 is opposed to the hand positioned in the take-in/take-out area of the workpiece take-in/take-out mechanism that will be described later, as shown in FIG. 3. At the first take-in/take-out position, the lifting means 33 adjusts the position of the support base 34 according to the storage position of the semiconductor wafer stored in the cassette 10 placed on the cassette placing table 32.

Returning to FIG. 1, the processing machine in the illustrated embodiment comprises a workpiece take-in/take-out mechanism 5 for taking-out the semiconductor wafer 11 as the workpiece from the cassette 10 placed on the above cassette placing table 32 and taking it into the cassette 10, and for carrying in, or out, the semiconductor wafer 11 into, or from, the aligning mechanism 4. The workpiece take-in/take-out mechanism 5 comprises a hand 51 for holding the semiconductor wafer 11, a hand support member 52 for supporting the hand 51, and a hand moving means 53 for moving the hand 51 supported on the hand support member 52 in a direction shown by an arrow Y. The hand 51 is formed like a fork and made of a thin plate material, and suction-holding holes 511 that communicate with a passage (not shown) formed in the inside thereof, are formed in the front surface of the hand 51. The suction-holding holes 511 are connected to a suction control means (not shown) via the above passage that is not shown. The hand moving means 53 comprises a male screw rod 531 which extends in the direction shown by the arrow Y and is rotatably supported onto the front face of the stationary base 2 and a pulse motor 532 for rotating the male screw rod 531, which can rotate in normal and adverse directions. The male screw rod 531 is screwed into a threaded hole 521 formed in the proximal end portion of the above hand support member 52. Therefore, when the pulse motor 532 is rotationally driven in one direction, the hand 51 supported on the hand support member 52 is moved in a direction shown by an arrow Y1, while when the pulse motor 532 is rotationally driven in the other direction, the hand 51 supported on the hand support member 52 is moved in a direction shown by an arrow Y2. That is, the hand moving means 53 brings the hand 51 to an approach position where the hand 51 goes into the cassette 10 placed on the above cassette placing table 32 and the above aligning mechanism 4, to a take-out position that locates above the workpiece placing area of a chuck table to be described later, and to a relief position from the take-out position.

The processing machine in the illustrated embodiment comprises a chuck table unit 6 for holding the semiconductor wafer carried out by the above workpiece take-in/take-out mechanism 5, a cutting unit 7 for cutting the workpiece held on the chuck table unit 6, a cleaning unit 8 for cleaning the workpiece cut by the cutting unit 7, and a workpiece conveying unit 9 for conveying the semiconductor wafer carried out by the above workpiece take-in/take-out mechanism 5 to the chuck table to be described later, of the chuck table unit 6 and the processed semiconductor wafer, which is held on the chuck table, to the cleaning unit 8.

The chuck table unit 6 comprises a support base 61 fixed on the stationary base 2, two guide rails 62 disposed on the support base 61 and arranged parallel to each other in the direction shown by the arrow X, and a chuck table 63 as a workpiece holding means for holding the workpiece, which is mounted on the guide rails 62 in such a manner that it can move in the direction shown by the arrow X. This chuck table 63 comprises an adsorption chuck support base 631 movably mounted on the guide rails 62, and an adsorption chuck 632 mounted on the adsorption chuck support base 631. The adsorption chuck 632 is connected to a negative pressure control means (not shown) so that negative pressure is suitably applied thereto. Therefore, the semiconductor wafer as a workpiece mounted on the adsorption chuck 632 is suction-held on the adsorption chuck 632 by activating the negative pressure control means that is not shown.

The chuck table unit 6 in the illustrated embodiment comprises a chuck table moving means 64 for moving the chuck table 63 along the two guide rails 62 in the direction shown by the arrow X. The chuck table moving means 64 comprises a male screw rod 641 arranged between the above two guide rails 62 and in parallel thereto, a female screw block (not shown) mounted to the adsorption chuck support base 631 and screwed into the male screw rod 641, and a drive source (not shown) such as a pulse motor for rotationally driving the male screw rod 641. Therefore, by turning the male screw rod 641 by the pulse motor (not shown), the chuck table 63 is moved in the direction shown by the arrow X. That is, the chuck table 63 can move between a workpiece placing area 6a and a processing area 6b. The above chuck table unit 6 has a turning mechanism (not shown) for turning the adsorption chuck 632.

A description is subsequently given of the above cutting unit 7.

The cutting unit 7 comprises a gate-like support base 71 fixed on the above stationary base 2. This gate-like support base 71 is laid across the above processing area 6b. Two guide rails 711 are installed on the flank of the support base 71 in such a manner that they are parallel to each other in the direction shown by the arrow Y, and two male screw rods 721a and 721b are arranged in parallel thereto between the two guide rails 711. A first base portion 73a and a second base portion 73b are arranged along the guide rails 711 in such a manner that they can slide in the direction shown by the arrow Y. The first base portion 73a and the second base portion 73b are provided with drive female screw blocks (not shown) to be screwed into the above male screw rods 721a and 721b, respectively, so that they can move in the direction shown by the arrow Y along the guide rails 711 by turning the male screw rods 721a and 721b by pulse motors 722a and 722b, respectively.

The first base portion 73a and the second base portion 73b are provided with a pair of guide rails 731a and a pair of guide rails 731b in the cutting feed direction shown by the arrow Z, and a first suspension bracket 74a and a second suspension bracket 74b are mounted on the guide rails 731a and 731b so that they can slide along the guide rails 731a and 731b in the cutting feed direction shown by the arrow Z, respectively. Further, the first base portion 73a and the second base portion 73b are provided with male screw rods (not shown), which are turned by drive sources such as pulse motors 75a and 75b and with female screw blocks to be screwed into the above male screw rods, respectively. Therefore, by driving the male screw rods (not shown) by the pulse motors 75a and 75b, the first suspension bracket 74a and the second suspension bracket 74b can be moved along the guide rails 731a and 731b in the cutting feed direction shown by the arrow Z perpendicular to the workpiece holding surface of the above adsorption chuck 632, respectively.

Figure 6:
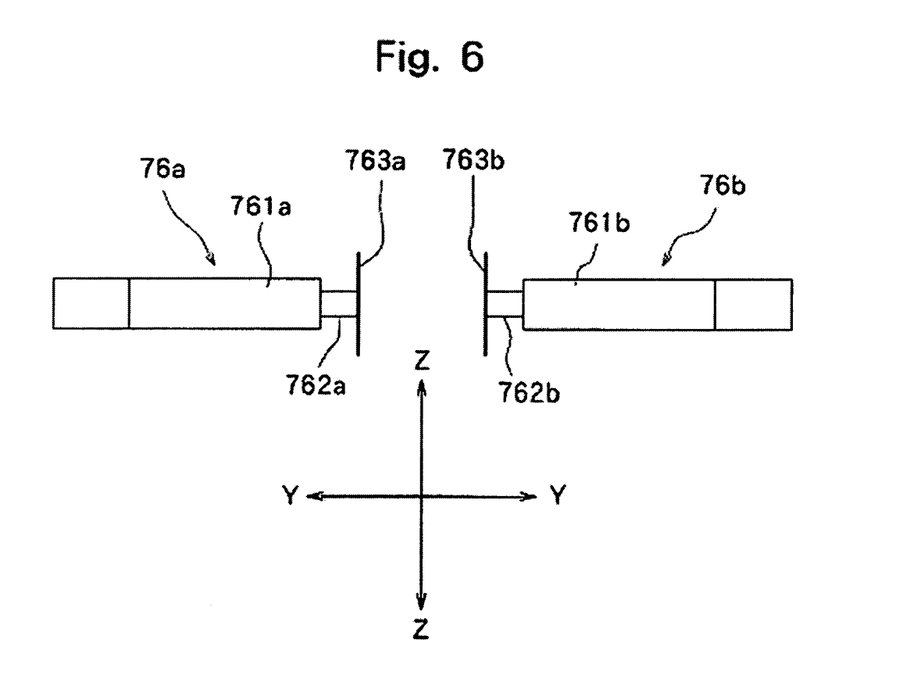
FIG. 6 is an explanatory diagram schematically showing a first spindle unit and a second spindle unit constituting the cutting machine shown in FIG. 1.

The first suspension bracket 74a and the second suspension bracket 74b are fitted with a first spindle unit 76a as a first cutting means and a second spindle unit 76b as a second cutting means, respectively. The first spindle unit 76a and the second spindle unit 76b will be described with reference to FIG. 6 in which they are illustrated in a simplified manner. The first spindle unit 76a and the second spindle unit 76b comprise a first spindle housing 761a and a second spindle housing 761b fixed to the first suspension bracket 74a and the second suspension bracket 74b, a first rotary spindle 762a and a second rotary spindle 762b rotatably supported to the first spindle housing 761a and the second spindle housing 761b, and a first cutting blade 763a and a second cutting blade 763b mounted to one ends of the first rotary spindle 762a and the second rotary spindle 762b, respectively. The first spindle unit 76a and the second spindle unit 76b thus constituted are arranged such that the first cutting blade 763a and the second cutting blade 763b are opposed to each other. That is, the first spindle unit 76a and the second spindle unit 76b are arranged on a straight line so that their axes extend in the indexing direction shown by the arrow Y. The first spindle unit 76a and the second spindle unit 76b thus constituted are provided with a first image pick-up means 77a and a second image pick-up means 77b which are constituted by a microscope, CCD camera or the like as shown in FIG. 1, respectively. The first image pick-up means 77a is secured to the first spindle housing 761a and the second image pick-up means 77b is secured to the second spindle housing 761b.

The above cleaning unit 8 is arranged on an extension connecting the above cassette-placing table 32 with the workpiece placing area 6a of the chuck table 63, and is composed of a known spinner cleaning/drying means having a spinner table 81. The above workpiece conveying unit 9 comprises a Bernoulli's pad 91 for suction-holding the top surface of the semiconductor wafer as the workpiece, a pad support member 92 for supporting the Bernoulli's pad 91, and a pad moving means 93 for moving the Bernoulli's pad 91 supported on the pad support member 92 in the direction shown by the arrow Y. The Bernoulli's pad 91 is constituted to be connected to an air supply means (not shown) to generate negative pressure by flowing out air along the inner wall of a conical pad 911 so as to suction-hold the semiconductor wafer as the workpiece. This pad support member 92 supports the Bernoulli's pad 91 by air cylinders 921 in such a manner that it can move in the vertical direction. The pad moving means 93 comprises a male screw rod 931 which extends in the direction shown by the arrow Y and is rotatably supported on the above gate-like support base 71, and a pulse motor 932 for driving the male screw rod 931, which can rotate in normal and adverse directions. The male screw rod 931 is screwed into a threaded hole 922 formed in the proximal end portion of the above pad support member 92. Therefore, when the pulse motor 932 is rotationally driven in one direction, the Bernoulli's pad 91 supported on the pad support member 92 is moved in the direction shown by the arrow Y3, while when the pulse motor 932 is rotationally driven in the other direction, the Bernoulli's pad 91 supported on the pad support member 92 is moved in the direction shown by the arrow Y4.

A description is subsequently given of the cutting operation of the above cutting machine with reference to FIG. 1 mainly.

Before the start of cutting, the cassette 10 before processing, storing a predetermined number of the semiconductor wafers 11 is placed on the cassette-placing table 32 while directing the workpiece take-in/take-out opening 101 (see FIG. 2 and FIG. 3) toward the workpiece placing area 6a. When a cutting start switch (not shown) is turned on, the lifting means 33 of the cassette-placing mechanism 3 is activated to bring the cassette 10 placed on the cassette-placing table 32 to the first take-in/take-out position shown in FIG. 2. When the cassette 10 is brought to the first take-in/take-out position shown in FIG. 2, the workpiece take-in/take-out mechanism 5 is activated to move the hand 51 in the direction shown by the arrow Y1 to bring it to an approach position where the hand 51 goes into the cassette 10. As a result, the hand 51 is brought to the approach position along the undersurface of the semiconductor wafer 11 placed on the predetermined rack of the cassette 10. Then, the suction control means (not shown) is activated to exert negative pressure onto the suction-holding holes 511 formed in the top surface of the hand 51, thereby making it to suction-hold the semiconductor wafer 11 on the top surface of the hand 51. After the semiconductor wafer 11 is thus suction-held on the top surface of the hand 51, the workpiece take-in/take-out mechanism 5 is activated to move the hand 51 in the direction shown by the arrow Y2 to bring the hand 51 that suction-holds the semiconductor wafer 11 to the take-out position above the workpiece placing area 6a shown in FIG. 1. Meanwhile, the lifting means 33 of the cassette-placing mechanism 3 is activated to bring the aligning mechanism 4 to the second take-in/take-out position shown in FIG. 3.

Then, the workpiece take-in/take-out mechanism 5 is activated again to move the hand 51 in the direction shown by the arrow Y1 to bring it to the take-out position. As a result, the forked hand 51 holding the semiconductor wafer 11 goes into the aligning mechanism 4 to become a state of putting the center table 42 between the forked hand 51 as shown in FIG. 5, and the semiconductor wafer 11 held on the top surface of the hand 51 is placed on the center table 42. At this point, part of the outer peripheral surface of the semiconductor wafer 11 is brought into contact with the arc face 441 or 442 of the centering member 44, whereby the semiconductor wafer 11 is centered. That is, when the semiconductor wafer 11 is an 8-inch semiconductor wafer, the centering member 44 is brought to a position shown by a solid line in FIG. 5, while when the semiconductor wafer is a 12-inch semiconductor wafer, the centering member 44 is brought to a position shown by a two-dot chain line in FIG. 5, and part of the outer peripheral surface of the semiconductor wafer 11 is brought into contact with the arc face 441 or 442. After the semiconductor wafer 11 is centered as described above, the suction-holding of the semiconductor wafer 11 by the hand 11 is canceled, and the negative pressure control means (not shown) is activated to suction-hold the semiconductor wafer 11 on the center table 42. In the illustrated embodiment, the centering member 44 is so constituted as to be allowed to move in the vertical direction. However, the centering member 44 may be fixed at a predetermined position and the hand 51 may be moved in the vertical direction according to the size of the semiconductor wafer 11.

Next, the aligning mechanism 4 carries out the alignment of the crystal orientation of the semiconductor wafer 11. That is, the electric motor 43 is rotationally driven to turn the center table 42 and its drive is stopped at a position where the semiconductor wafer crystal orientation detection means 46 (a set of the light emitting device 461a and the light receiving device 461b or a set of the light emitting device 462a and the light receiving device 462b) arranged at a position corresponding to the size of the semiconductor wafer 11 detects the notch 112 indicative of the crystal orientation, which is formed at the outer periphery of the semiconductor wafer, whereby the position of the crystal orientation of the semiconductor wafer is aligned. When the mark indicative of the crystal orientation of the semiconductor wafer 11 is an orientation flat, both ends of the orientation flat are detected by the semiconductor wafer crystal orientation detection means 46, the angle between the detected both ends is computed by a control means (not shown) based on this detection signal, and the center table 42 is turned the other way round by half the angle between the both ends to align the crystal orientation of the semiconductor wafer 11. After the crystal orientation of the semiconductor wafer 11 is aligned as described above, the center table 42 is turned by 90° and the suction-holding of the semiconductor wafer 11 is canceled. The semiconductor wafer 11 is then suction-held on the hand 51 of the workpiece take-in/take-out mechanism 5.

After the semiconductor wafer 11, of which the crystal orientation has been aligned as described above, is suction-held on the hand 51, the workpiece take-in/take-out mechanism 5 is activated to move the hand 51 in the direction shown by the arrow Y2 to bring the hand 51 holding the semiconductor wafer 11 to the take-out position above the workpiece placing area 6a shown in FIG. 1. And, the suction-holding of the semiconductor wafer 11 by the hand 51 is canceled. Meanwhile, the Bernoulli's pad 91 is brought to a position above the workpiece placing area 6a by operation of the pad moving means 93 of the workpiece conveying unit 9. As a result, the semiconductor wafer 11 supported on the hand 51 brought to the take-out position is positioned below the Bernoulli's pad 91 situated in the workpiece placing area 6a. Thereafter, the air cylinders 921 of the workpiece conveying unit 9 are activated to lower the Bernoulli's pad 91 to a position at which it comes into contact with the semiconductor wafer 11. The air supply means (not shown) is then activated to flow out air along the inner wall of the pad 911 to generate negative pressure thereby causing the semiconductor wafer 11 to be suction-held. After the semiconductor wafer 11 is suction-held by the Bernoulli's pad 91, the workpiece take-in/take-out mechanism 5 is activated to move the hand 51 in the direction shown by the arrow Y2 to bring it to the relief position where the cleaning unit 8 is located. Then, the air cylinders 921 of the workpiece conveying unit 9 are activated to lower the Bernoulli's pad 91 suction-holding the semiconductor wafer 11 to place the semiconductor wafer 11 on the chuck table 63 of the chuck table unit 6 positioned in the workpiece placing area 6a. The suction-holding of the semiconductor wafer 11 by the Bernoulli's pad 91 is canceled, and the suction control means (not shown) is activated to suction-hold the semiconductor wafer 11 on the chuck table 63.

After the semiconductor wafer 11 is suction-held on the chuck table 63, the chuck table 63 is moved in the direction shown by the arrow X, and the first base portion 73a and the second base portion 73b, to which the first suspension bracket 74a and the second suspension bracket 74b mounting the first spindle unit 76a and the second spindle unit 76b respectively are attached, are moved in the direction shown by the arrow Y to position the semiconductor wafer 11 on the chuck table 63 right below the first image pick-up means 77a and the second image pick-up means 77b, respectively. The front surface of the semiconductor wafer 11 is taken its image by the first image pick-up means 77a and the second image pick-up means 77b to each detect at least one of the streets formed on the front surface of the semiconductor wafer 11, and the respective detected streets are aligned with the first cutting blade 763a and the second cutting blade 763b in the direction shown by the arrow Y. On this occasion, in the illustrated embodiment, the positions of the first base portion 73a and the second base portion 73b in the direction shown by the arrow Y are precision controlled based on a measurement value obtained by one linear scale 78 provided on the support base 71. Since one linear scale is shared by the first base portion 73a and the second base portion 73b in the illustrated embodiment, the control in the direction shown by the arrow Y is carried out by the same scale, thereby improving accuracy as compared with when different scales are provided for the first base portion 73a and the second base portion 73b.

Thereafter, the first suspension bracket 74a and the second suspension bracket 74b supporting the first spindle unit 76a and the second spindle unit 76b are moved down to the cutting position, and the chuck table 53 suction-holding the semiconductor wafer 11 is moved in the direction shown by the arrow X which is the feed direction to the processing area 6b to be processed by action of the first cutting blade 763a and the second cutting blade 763b which rotate at a high speed, thereby forming a cutting groove having a predetermined depth along the above detected street. The indexing movement in the direction shown by the arrow Y of the first base portion 73a and the second base portion 73b fitted with the first suspension bracket 74a and the second suspension bracket 74b mounting the first spindle unit 76a and the second spindle unit 76b and the cutting feed in the feed direction shown by the arrow X of the chuck table 63 suction-holding the semiconductor wafer 11 are carried out repeatedly to form cutting grooves having a predetermined depth along streets 11a (see FIG. 2) formed on the semiconductor wafer 11 in the first direction. Further, after the cutting grooves having a predetermined depth are formed along the streets 11a formed on the semiconductor wafer 11 in the first direction, the adsorption chuck 63 suction-holding the semiconductor wafer 11 is turned by 90° to carry out the same cutting work as above, thereby forming cutting grooves having a predetermined depth along streets 11b (see FIG. 2) formed on the semiconductor wafer 11 in the second direction.

After the cutting work as described above is completed, the chuck table 63 situated in the processing area 6b shown in FIG. 1 is moved to the workpiece placing area 6a, and the suction-holding of the semiconductor wafer 11 is canceled. The workpiece conveying unit 9 is activated to suction-hold the semiconductor wafer 11 by the Bernoulli's pad 91 and carry it to the top of the spinner table 81 of the cleaning unit 8. Meanwhile, the hand 51 of the workpiece take-in/take-out mechanism 5 is brought to the take-out position above the workpiece placing area 6a. The processed semiconductor wafer 11 carried to the top of the spinner table 81 is cleaned and dried here. After the semiconductor wafer 11 is thus cleaned and dried, the workpiece conveying unit 9 is activated to suction-hold the semiconductor wafer 11 by the Bernoulli's pad 91 and brings it to a position above the hand 51 of the workpiece take-in/take-out mechanism 5 situated at the take-out position above the workpiece placing area 6a. The Bernoulli's pad 91 is lowered to place the semiconductor wafer 11 on the hand 51, the suction-holding of the semiconductor wafer 11 by the Bernoulli's pad 91 is canceled, and the semiconductor wafer 11 is suction-held on the top of the hand 51. Thereafter, the workpiece take-in/take-out mechanism 5 is activated to store the processed semiconductor wafer 11 held on the hand 51 in the predetermined storage chamber of the cassette 10.

Although the present invention has been described based on the illustrated embodiment, the present invention is not limited to this embodiment. That is, in the illustrated embodiment, the present invention is applied to a cutting machine having two cutting mechanisms. However, the same function and effect can be obtained even when the present invention is applied to a commonly used cutting machine having only one cutting mechanism.

Since the processing machine of the present invention is constituted as described above and comprises an aligning mechanism for aligning the crystal orientation of the semiconductor wafer below the cassette-placing table constituting the cassette-placing mechanism, a temporary storage area for installing the aligning mechanism does not need to be provided on the plane adjacent to the cassette-placing table, thereby making it possible to reduce the size of the processing machine.

What is claimed is:

1. A semiconductor wafer processing machine comprising
  a cassette-placing mechanism having a cassette-placing table for placing a cassette storing a semiconductor wafer, and an aligning mechanism for aligning a position of the crystal orientation of the semiconductor wafer, which is situated below the cassette-placing table and in contact with an outer peripheral wall of the semiconductor wafer,
  a workpiece take-in/take-out mechanism for taking out the semiconductor wafer stored in the cassette placed on the cassette-placing table and taking the semiconductor wafer into the cassette,
  a workpiece conveying mechanism for conveying the semiconductor wafer taken out by the workpiece take-in/take-out mechanism, a chuck table mechanism having a chuck table for holding the semiconductor wafer conveyed by the workpiece conveying mechanism, and a processing mechanism for processing the semiconductor wafer held on the chuck table, wherein the cassette-placing mechanism has a lifting means for bringing the cassette placed on the cassette-placing table to a first take-in/take-out position where the cassette is positioned in the take-in/take-out mechanism, and for bringing the aliging mechanism to a second take-in/take-out position where the aligning mechanism is positioned in the take-in/take-out area of the workpiece take-in/take-out mechanism, said aligning mechanism comprises a center table for placing the semiconductor wafer, a semiconductor wafer crystal orientation detection means for detecting a mark indicative of the crystal orientation formed on the outer peripheral wall of the semiconductor wafer placed on the center table, and a turning means for turning the center table, and a centering member has a plurality of arc faces which become concentric to the center table.

2. The semiconductor wafer processing machine according to claim 1, which comprises a plurality of semiconductor wafer crystal orientation detection means corresponding to sizes of the semiconductor wafer.

3. The semiconductor wafer processing machine according to claim 1, wherein the centering member has a plurality of position regulating portions corresponding to sizes of the semiconductor wafer.

4. The semiconductor wafer processing machine according to claim 1, wherein the chuck table mechanism has chuck table moving means for moving the chuck table between a workpiece placing area and a processing area;

the workpiece take-in/take-out mechanism comprises a hand for holding the semiconductor wafer on its top surface, and hand moving means for moving the hand to an approach position where it enters the cassette placed on the cassette-placing table and the aligning mechanism, a take-out position above the workpiece placing area and a relief position from the take-out position; and the workpiece conveying mechanism which has a Bernoulli's pad for holding the semiconductor wafer, holds the semiconductor wafer which has been held by the hand by means of the Bernoulli's pad and carried out to the take-out position, and carries the semiconductor wafer to the top of the chuck table moved to the workpiece placing area.

* * * * *